United States Patent
Yamada et al.

(10) Patent No.: US 8,262,798 B2
(45) Date of Patent: Sep. 11, 2012

(54) SHOWER HEAD, DEVICE AND METHOD FOR MANUFACTURING THIN FILMS

(75) Inventors: Takakazu Yamada, Shizuoka-ken (JP); Takeshi Masuda, Shizuoka-ken (JP); Masahiko Kajinuma, Shizuoka-ken (JP); Yutaka Nishioka, Shizuoka-ken (JP); Masaki Uematsu, Shizuoka-ken (JP); Koukou Suu, Chiba-ken (JP)

(73) Assignee: ULVAC, Inc., Kanagawa (JP)

( * ) Notice: Subject to any disclaimer, the term of this patent is extended or adjusted under 35 U.S.C. 154(b) by 0 days.

(21) Appl. No.: 10/911,639

(22) Filed: Aug. 5, 2004

(65) Prior Publication Data

US 2005/0056217 A1    Mar. 17, 2005

(30) Foreign Application Priority Data

Aug. 6, 2003    (JP) .................................. 2003-287762

(51) Int. Cl.
C23C 16/52    (2006.01)
C23C 16/455    (2006.01)
C23C 16/06    (2006.01)
C23C 16/22    (2006.01)

(52) U.S. Cl. .......... 118/724; 118/728; 118/50; 118/715; 156/345.29; 156/345.33; 156/345.34; 156/345.35; 156/345.36; 156/345.26; 156/345.51; 156/345.27

(58) Field of Classification Search .................. 118/715, 118/728, 50; 156/345.29, 345.33, 345.34, 156/345.35, 345.36, 345.26, 345.51

See application file for complete search history.

(56) References Cited

U.S. PATENT DOCUMENTS 5,350,480 A * 9/1994 Gray ......................... 156/345.26
5,366,764 A * 11/1994 Sunthankar ................ 427/248.1
5,565,382 A * 10/1996 Tseng et al. ................. 438/680

(Continued)

FOREIGN PATENT DOCUMENTS

EA    1 667 217 A1    6/2006

(Continued)

OTHER PUBLICATIONS

European Office Action dated Apr. 13, 2010, 7 pages.

*Primary Examiner* — Rudy Zervigon

(74) *Attorney, Agent, or Firm* — Arent Fox LLP

(57) ABSTRACT

The present invention herein provides a shower head whose temperature can be controlled in consideration of the film-forming conditions selected and a thin film-manufacturing device which permits the stable and continuous formation of thin films including only a trace amount of particles while reproducing a good film thickness distribution and compositional distribution, and a high film-forming rate and which is excellent in the productivity and the mass-producing ability as well as a method for the preparation of such a film. The shower head is so designed that the shower head structure is incorporated into an upper cap of a film-forming vessel, that a heat-exchange means is disposed in the upper cap to thus control the temperature of the upper cap and to in turn allow heat-exchange to occur at the contact surface between a disk-like shower plate constituting the shower head surface and the upper cap and that the temperature of the shower head can be controlled in consideration of the film-forming conditions selected. A thin film-manufacturing device is equipped with the shower head in its film-forming vessel and a thin film is prepared using the device.

14 Claims, 7 Drawing Sheets

U.S. PATENT DOCUMENTS

| | | | |
|---|---|---|---|
| 5,628,829 A * | 5/1997 | Foster et al. | 118/723 E |
| 5,788,799 A * | 8/1998 | Steger et al. | 156/345.37 |
| 5,891,350 A * | 4/1999 | Shan et al. | 216/71 |
| 5,906,683 A | 5/1999 | Chen et al. | |
| 6,019,848 A * | 2/2000 | Frankel et al. | 118/715 |
| 6,022,461 A * | 2/2000 | Kobayashi et al. | 204/298.07 |
| 6,096,134 A * | 8/2000 | Zhao et al. | 118/715 |
| 6,099,651 A * | 8/2000 | Sajoto et al. | 118/715 |
| 6,106,625 A | 8/2000 | Koai et al. | |
| 6,110,283 A * | 8/2000 | Yamamuka et al. | 118/715 |
| 6,170,429 B1 * | 1/2001 | Schoepp et al. | 118/723 R |
| 6,258,170 B1 * | 7/2001 | Somekh et al. | 118/715 |
| 6,453,992 B1 * | 9/2002 | Kim | 165/206 |
| 6,461,435 B1 * | 10/2002 | Littau et al. | 118/715 |
| 6,565,661 B1 * | 5/2003 | Nguyen | 118/715 |
| 7,001,491 B2 * | 2/2006 | Lombardi et al. | 204/192.12 |
| 7,009,281 B2 * | 3/2006 | Bailey et al. | 257/642 |
| 2003/0101938 A1 | 6/2003 | Metzner et al. | |
| 2004/0072426 A1 * | 4/2004 | Jung | 438/689 |
| 2004/0262155 A1 * | 12/2004 | Lombardi et al. | 204/298.01 |
| 2005/0070105 A1 * | 3/2005 | Bailey et al. | 438/689 |

FOREIGN PATENT DOCUMENTS

| | | |
|---|---|---|
| EP | 1 505 172 A2 | 2/2005 |
| JP | 05-082451 A | 4/1993 |
| JP | 05247635 A * | 9/1993 |
| JP | 09-316644 | 12/1997 |
| JP | 11-335849 A | 12/1999 |
| JP | 2007012724 A * | 1/2007 |
| WO | WO 03/048413 A1 | 6/2003 |

* cited by examiner

Introduction of Film-Forming Gas

Substrate-Transporting Port

SHOWER HEAD, DEVICE AND METHOD FOR MANUFACTURING THIN FILMS

BACKGROUND OF THE INVENTION

1. Field of the Invention

The present invention relates to a shower head, a thin film-manufacturing device and a method for manufacturing a thin film.

2. Description of the Related Art

In the conventional thin film-manufacturing device, in particular, such a device equipped with a mechanism for elevating or ascending and descending a substrate-supporting stage, the stage is moved or pulled along the exhaust direction upon the evacuation of the device (film-forming vessel) due to the play of the elevating mechanism and this accordingly leads to the loss of the balance of a concentric exhaust port (a path for evacuation) about the stage, which has been adjusted in advance under the atmospheric pressure. For this reason, in order to ensure a uniform film thickness distribution, it is necessary to use an exhaust port having a diameter of not less than 5 mm for the deviation of ±3% in the film thickness and a diameter of not less than 10 mm for the deviation of ±2% therein (see, for instance, WO 03/048413 A1 (Page 18; FIG. 8)). Moreover, such a device equipped with a mechanism for elevating a substrate-supporting stage should be so designed that it secures a large space (for instance, 3 L) below the substrate-supporting stage during the film-forming stage in order to elevate the stage from its substrate-transporting position to its film-forming position. This lower space is one for realizing the required isotropic evacuation, but the stage is pulled along the exhaust direction upon the evacuation of the device due to the play of the elevating mechanism as has been discussed above and this in turn leads to the loss of the balance of the concentric exhaust port, which has been adjusted in advance under the atmospheric pressure. Therefore, it has been needed to secure a space larger than that usually required.

There has also been known a device provided with a deposition-inhibitory plate for preventing any film-formation on the inner wall of the film-forming vessel. This device has a deposition-inhibitory plate-elevating mechanism for elevating the plate upon the film-formation and for letting it down upon the transfer of the substrate. In this case, however, a film-forming gas simply flows through the vessel during the film-forming step and therefore, a film is formed on the inner wall of the deposition-inhibitory plate, which constitutes the reaction space. This becomes a source of particles and this in turn shortens the maintenance cycle of the mass-production device.

In the case of the device equipped with the above deposition-inhibitory plate, the film-forming gas also passes around behind the outer wall of the plate, and a film is little by little formed even on the inner wall of the film-forming vessel. In the case of the device free of any deposition-inhibitory plate, a film is directly formed on the inner wall of the film-forming vessel. When the film is formed on the inner wall of the vessel up to a critical thickness, it is peeled off from the wall and this accordingly serves as a source of particles.

If the temperature of a shower head for introducing a film-forming gas into a reaction chamber is controlled in a conventional thin film-manufacturing device, the distance between the shower head and a substrate should be adjusted depending on the kinds of substrates and starting materials selected. However, a shower nozzle is a movable part (see, for instance, Japanese Un-Examined Patent Publication Hei 9-316644 (Claims, Examples)) and therefore, an unnecessary space is formed around the shower head and convection or a turbulent flow may be generated therein. This also serves as a source of particles and in turn makes the maintenance cycle of the mass-production device short.

In such a thin film-manufacturing device which requires the use of such temperature control, it is in general that the distance between the surface of the shower head (or shower plate) and a substrate is set at a level of not more than 40 mm and that the shower head is cooled by the circulation of an oil in an environment in which the surface of the shower head is extremely heated by radiation. However, there has not yet been developed any structure which permits the satisfactory dissipation of heat from the surface of the shower head or the satisfactory heat-exchange. For this reason, it has been needed to reduce the temperature of the circulated oil to an extremely low level. In this case, the temperature of the parts other than the shower head surface is reduced to a lower level even if the temperature of the shower head surface is controlled to an optimum level. This in turn results in the deposition of raw materials and becomes a cause of particle generation.

Regarding the device in which the foregoing temperature control is carried out, the strength of aluminum (Al) begins to cause an abrupt reduction in an environment in which the temperature of a cooling medium exceeds 120° C. and therefore, the passage of the cooling medium should presently be produced from such a material as SUS in consideration of safety. As has been well known in the art, SUS is highly inferior in the heat conduction (the heat conductivity of SUS is about 16 W/mK, while that of Al is about 240 W/mK) and it is thus quite insusceptible to heat transfer. For this reason, when the shower head surface is a separate plate-like part in the shower head structure whose parts constituting the passage of the cooling medium are produced from SUS, the separate plate-like part should be so designed that the heat-exchanging area between the plate and the parts constituting the passage is sufficiently large and the passage of the cooling medium is arranged in the proximity to the contact surface of the plate, for the improvement of the heat-exchange efficiency of the plate.

Moreover, in a conventional thin film-manufacturing device, quartz or alumina which is excellent in the heat resistance has been used as a material for preparing substrate-stage members which come in close contact with a heat source. However, alumina is insufficient in the thermal shock properties. Accordingly, there is observed an increase in the frequency of crack generation or breakage due to the ascent and descent of each substrate. In addition, the quartz is opacified and/or deteriorated due to the loss of $O_2$ in a reducing reaction atmosphere maintained at a high temperature and the film-forming environment for the substrate is thus changed. These phenomena may also serve as sources of particles. As a result, various problems arise such that the maintenance cycle of the device is shortened and that the device never permits any stable film-formation over a long period of time.

Furthermore, if the interior of the conventional thin film-manufacturing device is vented, the vent is conducted upwardly or from the lower space towards the upper space. Therefore, the vent is accompanied by the fling up of the particles generated during the formation of the film and accordingly, the interior of the reaction chamber should be cleaned for every vent. As disclosed in, for instance, an earlier patent application filed by the instant applicant or Japanese Patent Appln. Ser. No. 2003-61391, the number of particles as determined on the substrate increases even when stopping the gas supply between the substrate processing lots. For this reason, there has been desired for the development of a system which permits the down flow vent subsequent to the down flow state of the device without interruption of any gas supply.

The foregoing conventional devices are not designed in due consideration of any turbulent flow, convection and/or heat convection possibly encountered when letting a gas flow and they are quite liable to cause peeling off of the film during film-formation and to generate particles.

When the film formed on, for instance, the inner wall of the film-forming vessel is cleaned up as has been discussed above and the film is not efficiently removed through the reactions with, for instance, a plasma or a gaseous chemical, such cleaning must directly be conducted by an operator using a chemical such as nitric acid, but such operation is quite dangerous. Alternatively, it is sometimes necessary to use a large-scaled operation as another cleaning method, in which the film-forming vessel is dismantled or removed from the device, transported to a cleaning maker and cleaned therein. Consequently, such a thin film-manufacturing device is not practical as a mass-production type device which should highly safely and efficiently be used.

SUMMARY OF THE INVENTION

It is in general an object of the present invention to solve the foregoing problems associated with the foregoing conventional techniques and more specifically, it is an object of the present invention to provide a shower head having such a structure that it can exchange a sufficient quantity of heat and the temperature thereof can be controlled in consideration of the film-forming conditions selected and a thin film-manufacturing device which permits the stable and continuous formation of thin films including only a trace amount of particles while reproducing a good film thickness distribution and a compositional distribution, and a high film-forming rate and which is excellent in the productivity and the mass-producing ability, as well as a method for the preparation of such a film.

According to a first aspect of the present invention, there is provided a shower head used in a thin film-manufacturing device in which a film-forming gas is downwardly introduced into an upper space of a film-forming vessel capable of being evacuated to a desired vacuum through the shower head and then a film is formed on a substrate and the shower head is characterized in that it is so designed that the shower head structure is incorporated into an upper cap of the film-forming vessel, that a heat-exchange means is disposed in the upper cap to thus control the temperature of the upper cap and to in turn allow heat-exchange to occur at the contact surface between the disk-like shower plate constituting the shower head surface and the upper cap and that the temperature of the shower head can be controlled in consideration of the film-forming conditions selected. If the shower head has such a structure, the temperature thereof can be controlled while taking into consideration the film-forming conditions selected.

The foregoing shower plate is further characterized in that the area of the heat-exchanging portion of the shower plate is not less than 2.4 times that on the shower plate through which a film-forming gas passes; that the shower plate is pressed against the upper cap of the film-forming vessel at a load of not less than 28.4 kgf/cm$^2$ under the atmospheric pressure; that the thickness of the portion on the shower plate through which the film-forming gas passes is set at a level of not more than 5 mm; and that the thickness of the portion, on which the heat-exchange between the shower plate and the upper cap of the film-forming vessel takes place, is larger than that of the portion on the shower plate through which a film-forming gas passes.

According to a second aspect of the present invention, there is provided a thin film-manufacturing device in which a film-forming gas is downwardly introduced into an upper space of a film-forming vessel capable of being evacuated to a desired vacuum through the shower head and then a film is formed on a substrate and the device is characterized in that it is so designed that a shower head structure is incorporated into an upper cap of the film-forming vessel, that a heat-exchange means is disposed in the upper cap to thus control the temperature of the upper cap and to in turn allow heat-exchange to occur at the contact surface between the disk-like shower plate constituting the shower head surface and the upper cap and that the temperature of the shower head can be controlled in consideration of the film-forming conditions selected.

According to the present invention, in the device structure capable of controlling the occurrence of any turbulent flow, convection and/or heat convection or the device structure in which the distance between the shower head surface and the substrate is reduced and the gas flow is controlled, the temperature of the shower head (shower plate) surface which accepts a large quantity of radiant heat can be controlled in consideration of the film-forming conditions selected and therefore, the device can prevent any film-formation on, for instance, the deposition-inhibitory plate through the control of the decomposition and deposition of the film-forming gas to control the generation of particles and to thus stably form thin films having stable film quality and film characteristics over a long period of time.

The device of the invention is also characterized in that the area of the heat-exchanging portion of the shower plate is not less than 2.4 times that on the shower plate through which the film-forming gas passes. If the area of the heat-exchanging portion is smaller than the lower limit, the scattering in the temperature distribution observed on the shower plate may become large. However, the lower limit of this area of the heat-exchanging portion may vary depending on the size of a substrate used. For instance, in order to obtain a desired cooling effect in proportion to the size of the substrate, the area is preferably not less than 2.4 times for the substrate having a diameter of 150 mm, 200 mm and not less than 4 times for the substrate having a diameter of 300 mm. In addition, the upper limit of the area of the heat-exchanging portion may appropriately be selected while taking into consideration the size of each particular substrate used, but the upper limit is in general not more than 10 times in consideration of, for instance, the balance between various members of the device.

The device is characterized in that the shower plate is pressed against the upper cap of the film-forming vessel at a load of not less than 28.4 kgf/cm$^2$ under the atmospheric pressure. If the load is lower than the foregoing lower limit, the heat-exchange efficiency between the shower plate and the upper cap is impaired and simultaneously, the shower plate-fixing bolt is liable to cause "looseness" when the shower plate is subjected to a heat cycle.

The device is likewise characterized in that the thickness of the portion on the shower plate, through which the film-forming gas passes, is set at a level of not more than 5 mm. If the thickness exceeds 5 mm, the conductance of the shower hole is reduced.

In addition, the device is likewise characterized in that the thickness of the portion on the shower plate on which the heat-exchange between the shower plate and the upper cap of the film-forming vessel takes place is larger than that of the portion on the shower plate through which a film-forming gas passes. Thus, the heat-exchange efficiency in all the directions can be improved.

The device is also characterized in that the inner diameter of the foregoing film-forming vessel is larger than the diameter of the surface of the shower head and that the shower head surface diameter is larger than the inner diameter of the upper space of the film-forming vessel. The device is so designed that the ceiling of the upper space has an area smaller than that of the upper cap and that the area of the shower head surface is larger than that of the ceiling of the upper space and accordingly, the device is almost free of any unevenness and has thus a structure of a smallest space which is never accompanied by the generation of any turbulent flow and/or convection.

The device is also characterized in that the difference between the inner diameter of the foregoing film-forming vessel and the diameter of the shower head surface is not more than 20 mm. If the difference exceeds 20 mm, it is not possible to ensure a sufficient contact area between the film-forming gas and the substrate surface and this likewise makes the gas flow irregular. Moreover, the lower limit of this difference can appropriately be determined in consideration of the "rattling" of the upper cap due to its opening and shutting movement and the peripheral inert gas outlet. For instance, it is sufficient that the distance between them is not less than 4 mm.

In the thin film-manufacturing device, in general, the distance between the shower head surface and the substrate should be shortest in order to realize a structure which can minimize the upper space by the elimination of unnecessary spaces to thus suppress the occurrence of any turbulent flow, convection and/or heat convection. However, the shorter the distance, the stronger the radiant heat applied to the shower head surface from the substrate or the greater the quantity of radiant heat received by the surface and the greater the increase in the temperature of the shower head surface. To solve this problem, the shower head structure is incorporated into the upper cap of the film-forming vessel and a temperature-controlling medium (or coolant) is circulated through the same to thus control the temperature of the cap to an optimum level, while the upper cap is produced from SUS which can withstand the high temperature environment of the upper cap through which the coolant is circulated and an Al plate (or a shower plate) provided with shower holes is fitted to the surface of the upper cap. The device has such a structure that the heat of the shower plate which receives intense or severe radiant heat can be eliminated by securing a sufficiently large heat-exchange area between the upper cap and the shower head (shower plate) to thus improve the heat-exchange efficiency, that the temperature thereof can be controlled to a desired level or range and that the shower plate can simultaneously be fixed to the upper cap for certainty.

In this case, it is preferred that the flow path of the upper cap for circulating a coolant be preponderantly arranged on the side with which the shower head comes in contact and to which the plate is fixed so that heat may efficiently be exchanged between the upper cap and the shower plate and that a significant temperature difference is not established between the shower plate and the upper cap at all.

The device is also characterized in that the foregoing film-forming vessel is equipped with a means for controlling the internal temperature of the vessel to the range of from room temperature to 250° C. depending on the kinds of the raw gases used.

The device is also characterized in that the shower plate and the upper cap of the film-forming vessel are provided with a hole which can communicate these members with one another and that a meter for determining pressure is connected to the hole to thus monitor the pressure during the film-forming step.

As has been described above, according to the present invention, there can be provided a thin film-manufacturing device excellent in the productivity and mass-producing ability, which can stably and continuously form thin films containing only a trace amount of particles over a long period of time, while reproducing such excellent film thickness distribution, composition distribution and film-forming rate as those disclosed in WO 03/048413 A1 as discussed above. The device may show its power as a mass-production device which must satisfy the industrial requirements such as a low quantity of dust generated and good reproduction. In particular, the device shows its great power in the CVD processes which make use of thermal energy. The device also permits the reduction of the deposition of any film on the side wall of the film-forming vessel or the deposition-inhibitory plate to thus reduce the amount of dust generated during the film-forming step and to reduce the maintenance frequency and this in turn results in the reduction of the down time of the device and greatly contributes to the improvement of the productivity and mass-producing ability.

According to a third aspect of the present invention, there is provided a thin film-manufacturing method which comprises the steps of introducing a film-forming gas into an upper space of a film-forming vessel capable of being evacuated to a desired vacuum through a shower head structure incorporated into an upper cap of the film-forming vessel, the upper space being constituted by a substrate-supporting stage, the shower head and a deposition-inhibitory plate and forming a thin film on a substrate positioned in the upper space whose pressure is controlled to a film-forming pressure, while exhausting the excess film-forming gas and gaseous by-products as an exhaust gas through an exhaust system and in which the film is formed while controlling the temperature of the upper cap by a heat-exchange means incorporated into the upper cap to thus allow heat-exchange to occur at the contact surface between the disk-like shower plate constituting the shower head surface and the upper cap and the temperature of the shower plate is controlled in consideration of the film-forming conditions selected, during the film-forming step. The film-forming gas is a mixture of, for instance, a raw gas and an inert gas used for controlling the partial pressure.

The thin film-manufacturing method can be carried out using either of the foregoing devices likewise according to the present invention.

According to the shower head, the thin film-manufacturing device using this shower head and the thin film-manufacturing method of the present invention, the following effects can be expected: they can reproduce a good film thickness distribution and compositional distribution, and a high film-forming rate; and they permit the stable and continuous formation of thin films including only a trace amount of particles over a long period of time. The thin film-manufacturing device and method according to the present invention are excellent in the productivity and the mass-producing ability.

BRIEF DESCRIPTION OF THE DRAWINGS

FIG. 2A is a top plan view showing the relative arrangement of a substrate-supporting stage, a stage cover, a gas exhaust path and a deposition-inhibitory plate and FIG. 2B is a cross sectional view thereof;

FIG. 6A is a cross sectional view showing the upper portion of a film-forming vessel, FIG. 6B is an overall top plan view of the upper portion of the film-forming vessel observed when the upper portion of the vessel is cut at a desired level and FIG. 6C is a top plan view of the central portion of the upper portion of the film-forming vessel observed when the upper portion of the vessel is cut at a desired level;

FIG. 12A is a schematic cross sectional view showing the arrangement of the upper cap of the film-forming vessel and the shower plate and FIG. 12B is a top plan view thereof.

DESCRIPTION OF THE PREFERRED EMBODIMENTS

The present invention will hereunder be described in more detail while taking a CVD device as an example with reference to the accompanying drawings. The thin film-manufacturing device according to the present invention may be applied to a variety of thin film-manufacturing devices including, for instance, CVD devices which relate to or are used in chemical thin film-manufacturing methods and PVD devices used in physical thin film-manufacturing methods (such as the vacuum deposition method). Regarding the shower head as the characteristic property of the present invention, however, these devices are almost identical to one another and therefore, the present invention will be discussed below while taking a CVD device as an example.

Figure 1:
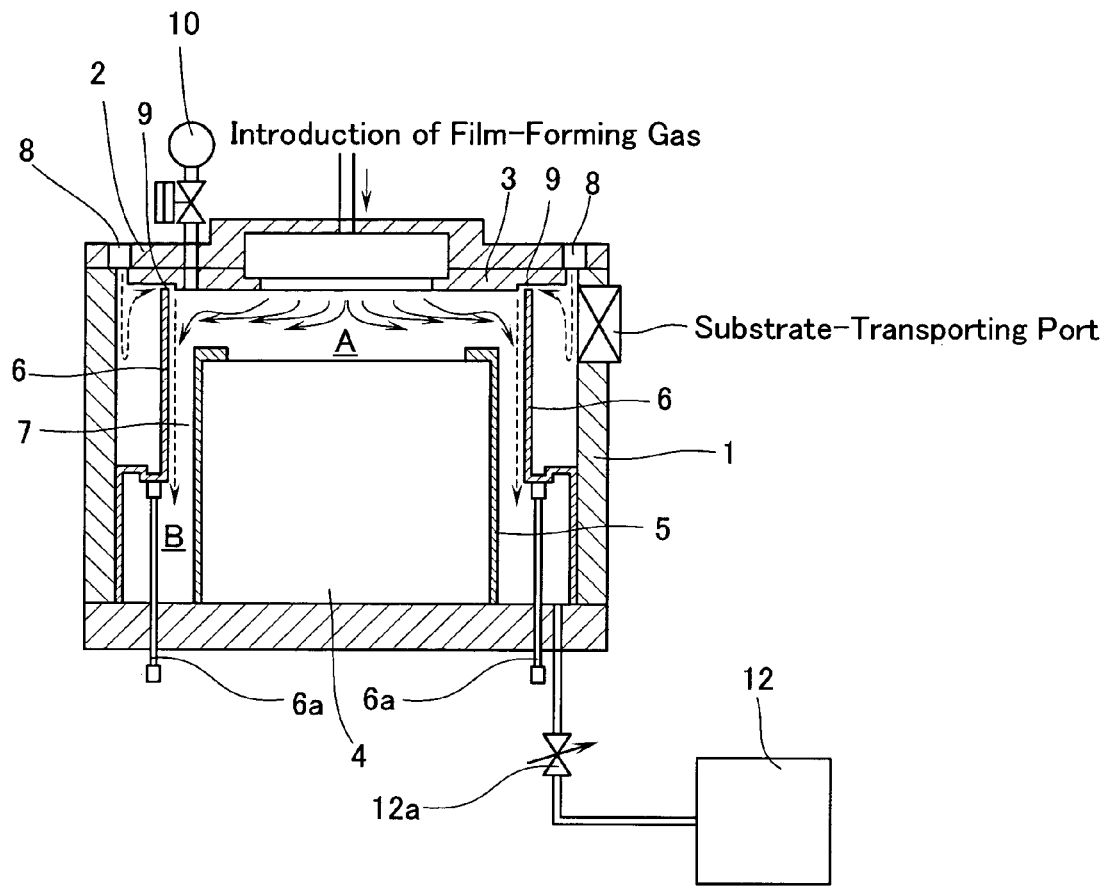
FIG. 1 is a schematic cross sectional view showing an exemplary structure of the thin film-manufacturing device according to the present invention.

FIG. 1 is a schematic cross sectional view showing a structure of a film-forming vessel as a principal component of the thin film-manufacturing device according to the present invention.

In a film-forming vessel 1 shown in FIG. 1, a shower head 3 (also referred to interchangeably as a shower plate) is incorporated into an upper cap 2 of the film-forming vessel and a substrate-supporting stage 4 opposed to the shower head 3 is arranged at the lower portion of the vessel. The stage 4 as shown in FIG. 1 is fixed so as not to rotate or go up and down. However, the stage 4 may be an elevating one. A stage cover 5 is preferably fitted to the outer peripheral side wall of the stage 4. A deposition inhibitory plate 6 is arranged in the proximity to the side wall of the stage 4 at a desired interval and this plate 6 is fitted thereto in such a freely elevating manner that it can ascend during the film-formation and descend during the transportation of the substrate by the action of a deposition inhibitory plate lifter 6a as an elevating (or ascent and descent) mechanism. A reaction space A during the film formation is constituted or defined from these shower head 3, substrate-supporting stage 4 and deposition-inhibitory plate 6. The interstice formed from the deposition-inhibitory plate 6 and the substrate-supporting stage 4 constitutes a concentric gas exhaust path or passage 7 about the stage 4. This film-forming vessel 1 is so designed that an inert gas can be introduced into the film-forming vessel through an opening 8 formed on the outer periphery of the upper cap 2 such that the inert gas may flow, through an inert gas injection port 9, from the upstream side of the gas exhaust path 7 towards the downstream side thereof along the inner wall of the deposition-inhibitory plate 6. Accordingly, the film-forming vessel is so designed that a lower space B having a volume larger than that of the reaction space A is disposed and directly connected to the gas exhaust path 7 constituted by the substrate-supporting stage 4 and the deposition-inhibitory plate 6 so that isotropic exhaustion can thus be established. The pressure in the film-forming vessel during the film-formation is so controlled that the pressure can be selected in response to processes by the feedback of the pressure from a pressure indicator 10 fitted to the upper cap 2 to a pressure-control valve 11.

Moreover, an evacuation system 12 is connected to the film-forming vessel 1 through a valve 12a so as to control the pressure within the film-forming vessel. Moreover, there is a space between the film-forming gas introduction port formed on the upper part of the film-forming vessel and the shower head 3, in which the introduced gas can spread and which may serve as a reaction space. The film-forming vessel 1 is likewise provided with a mixing unit for supplying the film-forming gas to the shower head incorporated into the upper cap 2, which is connected to the vessel through the film-forming gas piping; and a vaporization system (vaporizer) connected to the mixing unit through the raw gas piping. The components constituting the device including, for instance, gas piping systems, various valves and mixing units arranged between the vaporization system and the film-forming vessel are provided with a heating means such as a heater and/or a heat-exchanger so as to maintain the vaporized raw gas to a temperature level at which the raw gas never undergoes any liquefaction, deposition and/or film-formation. As will be described in detail with reference to FIG. 5 below, the piping system arranged between the vaporization system and the mixing unit is equipped with a valve V3 and the piping system arranged between the vaporization system and the exhaust system is equipped with a valve V4 so that the vaporization system, the mixing unit and the exhaust system can be shut down. This is because these vaporization system, mixing unit and exhaust system are different in their maintenance cycles from one another and the valves are used for preventing any adhesion, to these components, of substances such as moisture which may adversely affect the film-formation when the film-forming vessel is open to the atmosphere. In other words, the device is so designed that one component can be opened to the air to carry out its maintenance while the other two components are not opened to the air and they can be kept at a vacuum.

A thin film may be prepared according to the following procedures while using the device as shown in FIG. 1. A film-forming gas (a mixed gas comprising, for instance, a raw gas used in a chemical reaction, a reactive gas, and an inert gas used for controlling the partial pressure, or independent gases separately introduced) is introduced into the device from the upper portion of the upper cap 2 of the film-forming vessel 1 through a gas introduction port and the film-forming gas is then blown, through the shower head 3, on a substrate mounted on the substrate-supporting stage 4 to thus conduct film-formation. At this stage, the excess film-forming gas, the reaction by-products or the like are isotropically discharged to the exterior of the film-forming vessel through the gas exhaust path 7. An inert gas is introduced into the film-forming vessel 1 through an opening 8 formed on the outer periphery of the upper cap 2 during the film-formation to thus downwardly let the inert gas flow from the upstream side of the exhaust path 7 through an inert gas-injection port 9 along the inner wall of the deposition-inhibitory plate 6. In this respect, the lower space B having a volume larger that that of the reaction space A is disposed in such a manner that it is directly connected to the gas exhaust path 7 constituted by the deposition-inhibitory plate 6 and the substrate-supporting stage 4 and consequently, such isotropic exhaustion may be realized.

Figures 2A, 2B:
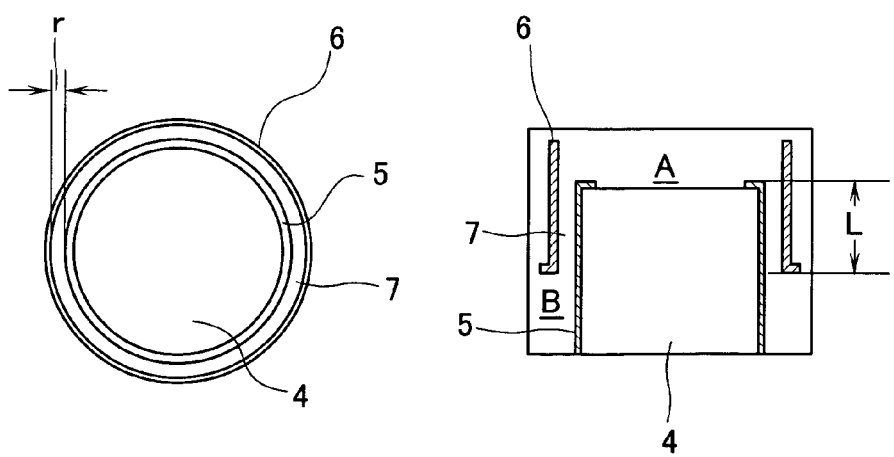
FIGS. 2A and 2B are diagrams each showing the arrangement of the components or elements shown in FIG. 1 and more specifically.

FIG. 2A is a top plan view showing the relative arrangement of a substrate-supporting stage, a substrate-supporting stage cover, a gas exhaust path and a deposition-inhibitory plate which constitute the film-forming vessel shown in FIG. 1 and FIG. 2B is a cross sectional view thereof. As will be seen from FIGS. 2A and 2B, the stage cover 5 is arranged on the outer peripheral portion of the substrate-supporting stage 4 and further the gas exhaust path 7 and the deposition-inhibitory plate 6 are disposed around the outer periphery of the stage cover and the gas exhaust path 7 constituted by the deposition-inhibitory plate and the substrate-supporting stage is so designed that the size (or width) is equal to "r". Moreover, the gas exhaust path is likewise so designed that the vertical length thereof is equal to "L", as shown in FIG. 2B.

Figure 3:
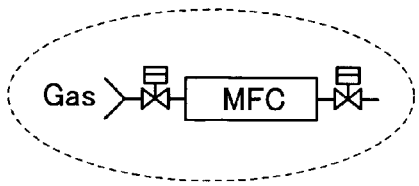
FIG. 3 is a circuit diagram showing the usual gas source.

Gas sources (for instance, a raw gas source, a reactive gas source and an inert gas source) whose gas flow rate can be controlled as shown in FIG. 3 are connected to the primary side of the film-forming gas introduction port and these gas sources are integrated so that a plurality of gases can be supplied through only one gas source.

Figure 4:
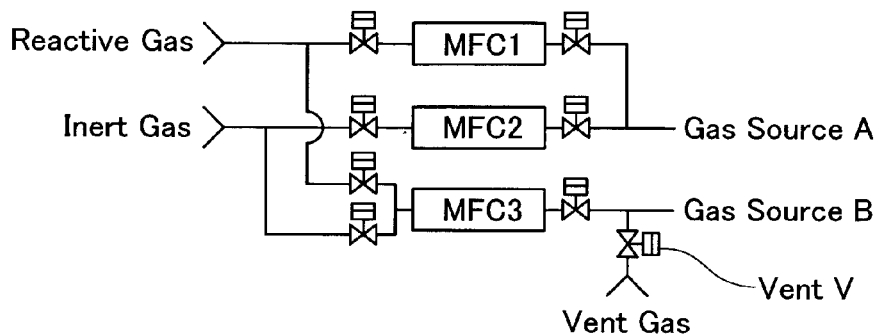
FIG. 4 is a circuit diagram showing a gas source according to an embodiment of the present invention.

FIG. 4 shows an example of the foregoing integrated gas source. Gas sources A and B are connected to corresponding necessary lines, respectively. More specifically, the gas sources A and B are connected to a reaction gas line and an inert gas line through corresponding valves and mass flow controller (MFC1, MFC2, MFC3), respectively. Further, A vent gas line is connected to the line for the gas source B through a vent V and the vent V may be a slow vent V.

Figure 5:
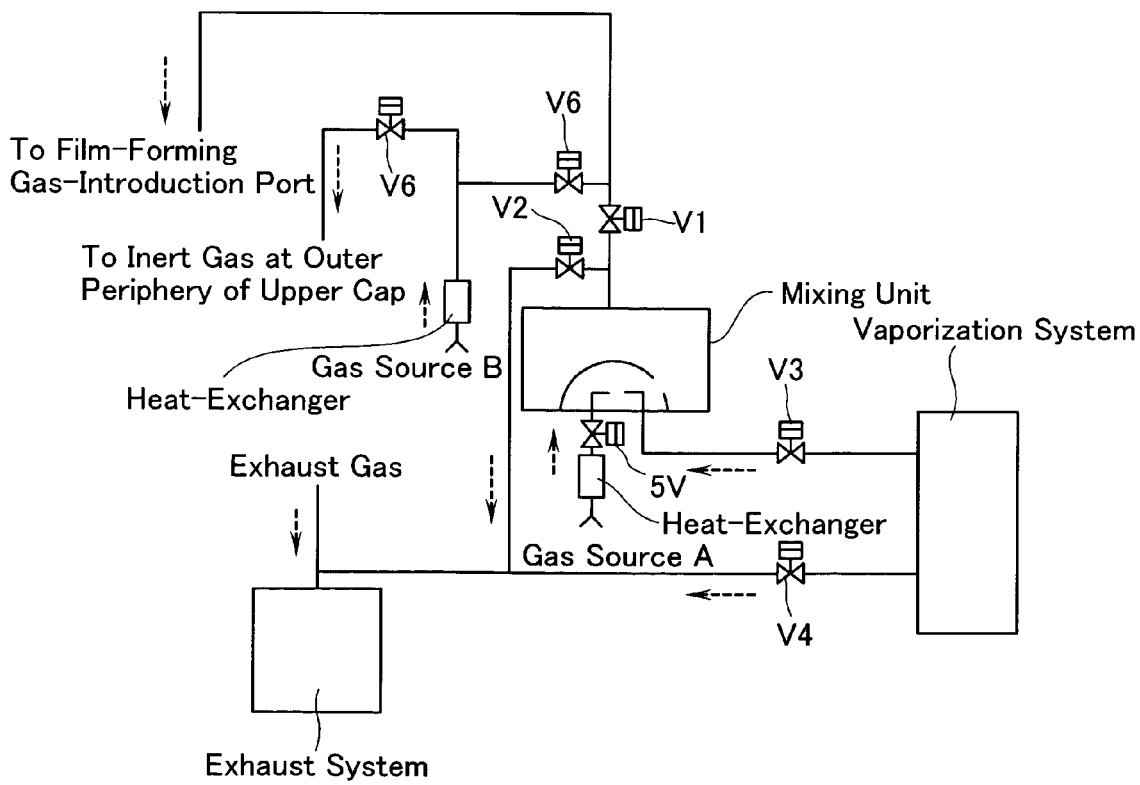
FIG. 5 is a circuit diagram showing a gas passage according to an embodiment of the present invention.

In the present invention, a gas passage system as shown in FIG. 5 is disposed between the gas source (FIG. 4) and the film-forming gas-introduction port (FIG. 1). This system is so designed that gases from the raw gas source in which a (liquid) raw material is vaporized by a vaporization system and from the gas source A capable of supplying a reactive gas required for the process (a gas mixture obtained by admixing an inert gas and a reactive gas in a rate suitable for the process [hereunder simply referred to as "reactive gas"]) are supplied to the mixing unit wherein the gases are uniformly admixed together. In this respect, the mixing unit has such a structure that the raw gas and the reactive gas are introduced into the unit from the directions opposed to one another and uniformly admixed together through stirring and diffusion to thus give a film-forming gas (see Japanese Patent Appln. Ser. No. Hei 13-369279). This film-forming gas is introduced into the reaction vessel 1 shown in FIG. 1 through the film-forming gas-introduction port by the opening of the valve V1 and fed to the surface of the substrate through the shower head 3. The inert reactive gas from the gas source B is introduced into the film-forming vessel 1 through the opening 8 positioned at the outer periphery of the upper cap 2 of the vessel by the opening of the valve V6. Similarly, when venting the interior of the film-forming vessel, a vent V such as a slow vent V and a valve V5 are opened to thus introduce a vent gas into the vessel through the film-forming gas-introduction port and the shower head 3. Incidentally, all of the components (including the mixing unit) arranged between the heat-exchanger and the primary side of the gas passage as shown in FIG. 5 are equipped with a heating means such as a heater or a temperature control means such as a heat-exchanger so that the temperature of these components can be controlled to the range of from room temperature to 250° C. In addition, all of the piping systems connected to the raw gas source are likewise provided with a temperature control means similar to that described above so that the temperature of these piping systems can be controlled to the range of from room temperature to 250° C.

Then the operations or behaviors of the gas passages shown in FIG. 5 will hereunder be described in more detail. The mixing unit is connected to the vaporization system through a piping system provided with a valve V3 and, at the same time, it is also connected to gas sources (such as the reactive gas source and the inert gas source) through a valve V5 and a heat-exchanger, and subsequently a mass flow controller (not shown), respectively. The film-forming gas uniformly admixed in the mixing unit is transported to the film-forming gas-introduction port through a piping system provided with a valve V1 and then fed to the surface of a substrate on which a film is deposited and which is mounted on the substrate-supporting stage within the film-forming vessel. A gas supply systems for supplying an inert gas such as carrier gas (for instance, $N_2$ gas) other than the reactive gas are also connected to the reactive gas source. Each gas supply system is so designed that the reactive gas or the carrier gas from the gas source is transported to the mixing unit along the piping system through the mass flow controller and/or the heat-exchanger. The reactive gas may be, for instance, a gas adapted to the raw gas for forming a desired film such as $H_2$ or the like in case of reducing reactions, $NH_3$ gas or the like for nitrification reactions and $O_2$ or the like in case of oxidation reactions. The raw gas is, for instance, one obtained by vaporizing a raw liquid comprising an organic solvent and, for instance, an organometal compound dissolved therein.

There are introduced, into the mixing unit and admixed therein, the reactive gas supplied from the reactive gas source and heated to an appropriate temperature and the raw gas generated in the vaporization system and fed through a piping system maintained at a temperature at which the gas is never liquefied and/or deposited and/or never undergoes any film-formation. Thus, a film-forming gas (for instance, a mixture of the reactive gas and the raw gas) can be obtained. The raw gas comprises a single gas or a mixture of several kinds of gases. The film-forming gas thus obtained is introduced into the film-forming vessel through a piping system.

The piping system arranged between the vaporization system and the mixing unit and that positioned between the mixing unit and the film-forming gas-introduction port may be connected together through a VCR joint. VCR gaskets for some of the joints for the piping systems are not simple rings, but may be VCR type particle-captures in which the portion corresponding to the hole of a ring serves as a particle-capture. It is desirable that this joint provided with such a particle-capture be set and maintained at a temperature higher than that at which the raw gas is never liquefied and/or deposited and that a specific vaporized raw element required for the reaction be never adhered to or captured by the joint or the particle-capture.

In the film-forming gas supply-line positioned between the mixing unit and the film-forming vessel, the valves (V1 and V2) for switching film-forming gases are disposed at the secondary side of the mixing unit 5. The downstream sides of these valves V1 and V2 are connected to the film-forming vessel and the exhaust system, respectively. When forming a thin film, the valve V1 is opened and the valve V2 is closed, while after the completion of the film-formation, the valve V2 is opened and the valve V1 is closed. The raw gas and the reactive gas are not uniformly admixed together and they are in an unstable state for initial several instants immediately after the introduction of these gases into the mixing unit and therefore, the valve V1 is closed and the valve V2 is opened to thus flow the mixed gas comprising the raw gas and the reactive gas towards the exhaust system. Then after establishing the stable state of the mixed gas, the valve V2 is closed, while the valve V1 is opened so that the film-forming gas can be introduced into the reaction space through the shower head. Moreover, the device is so designed that, at an instant when the film-formation is completed, the valve V2 is opened, while the valve V1 is closed for a very short period of time and the excess film-forming gas which is not used in the reaction in the mixing unit is discharged through the exhaust system to thus instantaneously stop the introduction of the film-forming gas into the reaction space and to prevent the introduction of any film-forming gas into the reaction space.

The vaporization system is not shown in the attached figures, but it is constituted by a raw material-supply zone and a vaporization zone. This vaporization system has such a structure that a raw liquid comprising an organic solvent and a liquid or solid raw material dissolved therein is pressed and transported by a pressurized gas (for instance, an inert gas such as He gas), the flow rate of each raw liquid fed under pressure is controlled by each corresponding liquid flow rate-control unit and then each raw liquid is supplied to the vaporization zone. The vaporization zone is so designed that each raw liquid whose flow rate has been controlled can be vaporized in high efficiency and then the raw gas obtained through the vaporization can be supplied to the mixing unit. In this vaporization zone, when only one raw liquid is used, a single liquid can be vaporized or when a plurality of raw liquids are used, these liquids are admixed together and then the resulting mixture can be vaporized. When vaporizing the raw liquid, it is preferred that not only droplets of the raw liquid are vaporized, but also the raw liquid is converted into fine droplets by applying a gas jet, physical vibrations and/or ultrasonics to larger droplets and the resulting fine droplets are introduced into the vaporization zone through a nozzle provided to the wall of the vaporization zone and vaporized therein to thus improve the vaporization efficiency. It is preferred that a vaporization member made of a highly heat-conductive material such as Al be arranged within the vaporization zone such that the droplets or liquid particles can be vaporized in place in high efficiency and in order to reduce the load during the vaporization of the droplets or liquid particles due to the use of the particle-capture. Moreover, particle-capture may be disposed within the vaporization zone in order to prevent any leakage of particles originated from the residues generated when the raw liquid is vaporized from the vaporization zone and in order to make the vaporization of the droplets flowing into the zone in a small amount without causing any suction of the droplets in the exterior of the vaporizer by the action of vacuum. In these vaporization member and particle-capture, it is preferred that they are maintained at a temperature suitable for the vaporization in order to certainly vaporize droplets and fine liquid particles which are brought into contact with these components and to prevent any adhesion and capture of vaporized specific raw elements required for the desired reaction. In this respect, the vaporization system may be so designed that a solvent for a raw material can be introduced into the vaporization zone while controlling the flow rate thereof by a flow rate controller and then the solvent can be vaporized in the zone to thus obtain a solvent gas.

In this connection, the desired reaction is initiated by supplying a film-forming gas on a heated substrate on which a film is to be deposited through the shower head 3, while the excess film-forming gas, the by-product gases generated through the reaction and the reaction product gas are exhausted through the exhaust system. The shower head 3 incorporated into the upper cap 2 of the film-forming vessel 1 may be provided with a particle-capture as a filter member for trapping the particles present in the film-forming gas. The shower head 3 is appropriately heated to maintain the temperature thereof to a level at which the gas introduced is not liquefied, deposited and/or converted into a film. In addition, the temperature of the particle-capture is desirably controlled such that vaporized specific raw elements required for the desired reaction are never adhered to or trapped by the particle-capture.

A pressure control valve arranged between the foregoing vaporization system and the film-forming vessel would permit the easy establishment of a variety of film-forming pressure conditions.

The thin film-manufacturing device according to the present invention is so designed that the distance between the shower plate surface and the substrate is fixed or a constant irrespective of whether the substrate is subjected to a film-forming operation or it is transported, i.e. when forming the thin film and transporting the substrate. However, the device may likewise have a structure such that any distance may be selected from, for instance, three kinds of distances such as 10 mm, 25 mm and 40 mm by appropriately selecting a spacer at the stage of assembling the substrate-supporting stage.

Figure 6A:
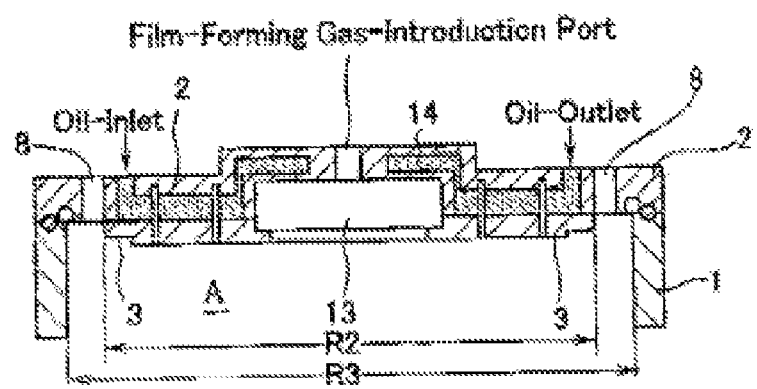
FIGS. 6A to 6C are schematic diagrams showing an embodiment of the thin-film manufacturing device of the present invention, and more specifically.
Figure 6B:
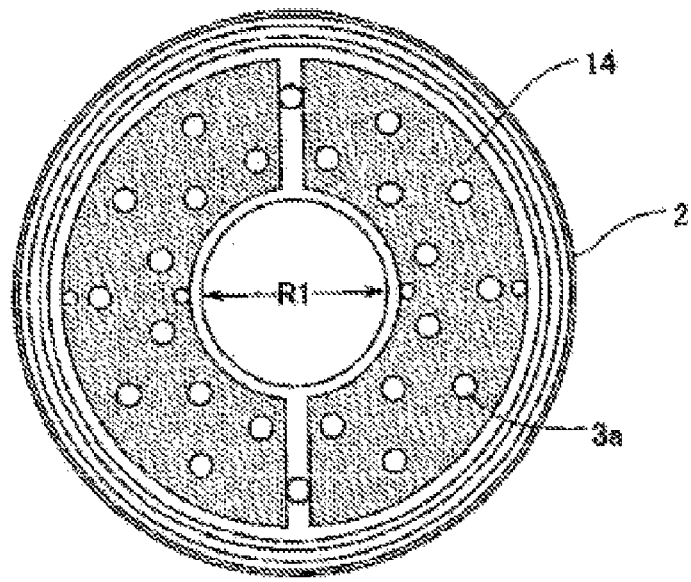
Figure 6C:
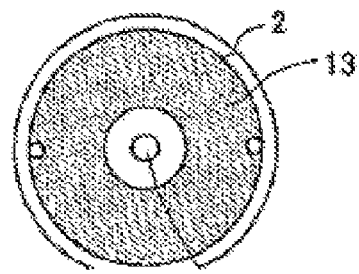

Then, the upper cap of the film-forming vessel and the shower plate in the thin film-manufacturing device of the present invention will hereunder be described in more detail with reference to FIG. 6. In FIG. 6, the same reference numerals used in FIG. 1 are used for specifying the components identical to those appearing in FIG. 1. FIG. 6A is a cross sectional view showing the upper portion of the film-forming vessel 1, FIG. 6B is an overall top plan view of the upper portion of the film-forming vessel observed when the upper portion of the vessel is cut at a desired level and FIG. 6C is a top plan view of the central portion of the upper portion of the film-forming vessel observed when the upper portion of the vessel is cut at a desired level.

As shown in FIG. 6, a shower head structure including a portion 13 at which the gas introduced spreads may be incorporated into the upper cap 2 to thus integrate the upper cap 2 and the shower head 3 or to obtain a unified structure comprising these two members. In addition, the shower plate 3 is so designed that it has a size or an area almost identical to that of the ceiling of the film-forming vessel 1. Such a structure can establish a large heat-exchangeable region (or contact area) on the shower plate 3 as shown in FIG. 6 and the desired heat-exchange can thus be conducted in high efficiency.

The shower plate 3 is so designed that the area thereof is larger than that of the ceiling of the reaction space A encircled or surrounded by the shower plate 3, the substrate-supporting stage 4 and the deposition-inhibitory plate 6 as shown in FIG. 1. In other words, the device has such a structure that the reaction space (or the area on the shower plate which receives radiation) is reduced while a sufficiently large area is ensured for the heat-exchange of the shower plate 3.

The upper cap 2 is made of SUS and has such a structure that the temperature thereof can be controlled by an oil-circulation path 14 extending from an oil inlet to an oil outlet as shown in FIG. 6. The oil-circulation path 14 is widely spreading throughout the interior of the upper cap and tapped holes 3a for fixing the shower plate 3 are distributed within the region filled with oil in an island-like shape and the oil-circulation path is wide. Accordingly, the temperature of the upper cap 2 can be set at a uniform level and it can be well-controlled. Most part of the oil-circulation path 14 is arranged in such a manner that it comes into close contact with the surface of the shower plate 3 incorporated into the upper cap 2 to thus improve the heat-exchange efficiency. For this reason, the device of the invention has such a structure that it can realize an excellent heat-exchange efficiency and can thus cope with, in particular, severe environments such that the temperature of the substrate during film-formation is very high, the distance between the shower plate and the substrate is quite short, and the shower plate 3 is heated by intense radiation. The medium used in this circulation path is not restricted to an oil and may be known temperature-control mediums inasmuch as they have a function identical to that of the oil.

It is preferred that the shower plate 3 has a concave shape when observing the same from the lateral direction and the portion thereof through which a gas passes has a thickness (in general, about 5 mm) which makes the conductance of the shower hole optimum.

The heat-exchange portions of the shower plate 3 and the upper cap 2 are so designed that they are thick (for instance, about 10 mm) for the improvement of the uniformity of the temperature of the heat-exchange portion of the shower plate and therefore, the heat-exchange efficiency is improved by spreading the heat of the shower plate throughout the entire area of the plate and then allowing heat-exchange to occur.

EXAMPLES

The device and method according to the present invention will hereunder be described with reference to the following Examples, but the present invention is not restricted to these specific Examples at all.

The following are standard film-forming conditions for preparing PZT films according to the MOCVD technique. In the following Examples, thin films were formed under these film-forming conditions using the device of the present invention.

| Raw Material | Concentration | Established Flow Rate |
|---|---|---|
| Pb(dpm)$_2$/THF | 0.3 mole/L | 1.16 mL/min |
| Zr(dmhd)$_4$/THF | 0.3 mole/L | 0.57 mL/min |
| Ti(iPrO)$_2$(dpm)$_2$/THF | 0.3 mole/L | 0.65 mL/min |
| N$_2$ (carrier gas) | — | 500 sccm |
| Reactive Gas: O$_2$ | | 2500 sccm |
| Inert gas at the periphery of gas head: N$_2$ | | 1500 sccm |
| Film-Forming Pressure: This is always adjusted to a constant value of 5 Torr using a pressure control valve. | | |
| Temperature of Substrate: 580° C. | | |
| Shower Plate-Substrate Distance: 30 mm | | |

Figure 7:
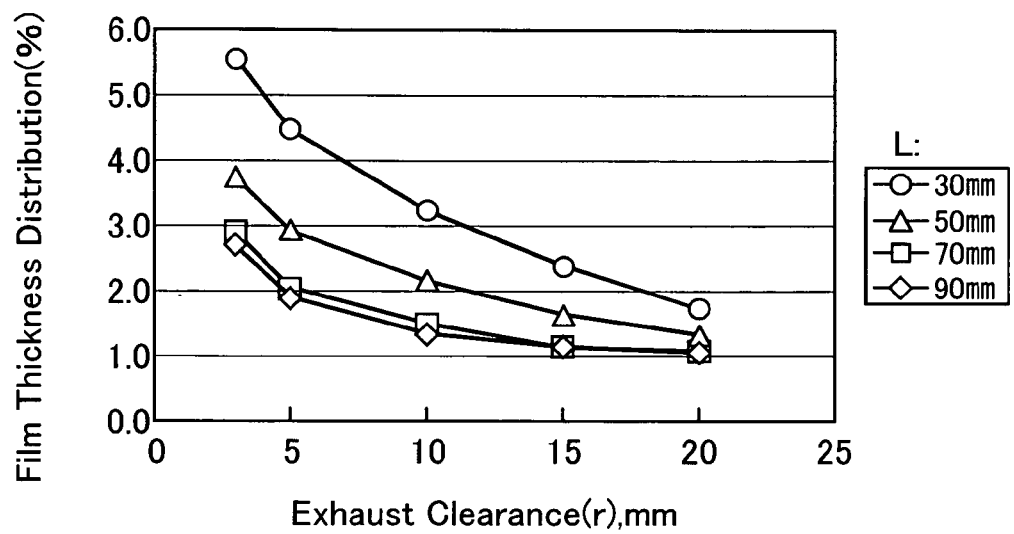
FIG. 7 is a graph showing the relation between the exhaust clearance and the film thickness distribution.

Using a thin film-manufacturing device shown in FIG. 1, a PZT film was formed on an electrode substrate of 8 inches mounted on the substrate-supporting stage 4 under the foregoing film-forming conditions while variously changing the size of the gas exhaust path 7 or the exhaust clearance (r: 3 to 20 mm) and the vertical length thereof (L: 30, 50, 70, 90 mm). The film thickness distribution (%) of the resulting film is shown in FIG. 7 as a function of the exhaust clearance. As will be seen from the result shown in FIG. 7, a stable thickness distribution having a scattering of not more than 3% within the film surface (i.e. within wafer uniformity) can be obtained with a good reproducibility when the size (r) and the vertical length (L) of the exhaust path are set at levels of not less than 3 mm and not less than 70 mm, respectively.

Figure 8:
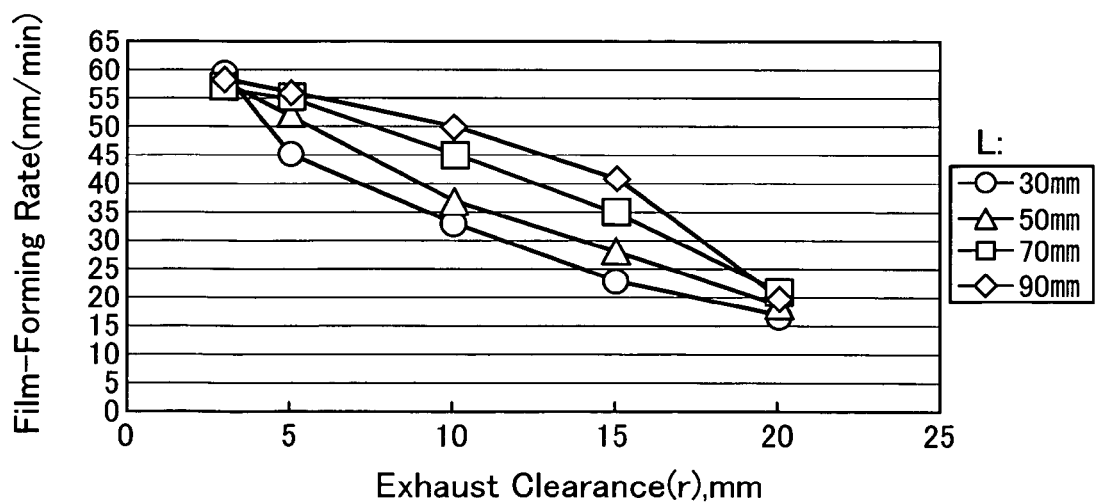
FIG. 8 is a graph showing the relation between the exhaust clearance and the film-forming rate observed at the center of the substrate.

In addition, a PZT film was formed on an electrode substrate of 8 inches under the foregoing film-forming conditions while variously changing the size of the gas exhaust path or the exhaust clearance (r) and the vertical length thereof (L). The relation between the exhaust clearance and the film-forming rate observed during the film-formation is shown in FIG. 8. The film-forming rates observed at the centers of the substrates are determined and compared with one another since the film thickness distribution may vary depending on the film-forming conditions selected. In the mass-production device, the film-forming time is desirably not more than 3 minutes while taking into consideration the throughput. For instance, if the target film thickness is set at 100 nm, the film-forming rate should be set at a level of not less than about 35 nm/min. The data shown in FIG. 8 clearly indicate that film-forming conditions which can satisfy this requirement for the film-forming rate are as follows: the size of the exhaust path (r) ranging from 3 to 15 mm for the vertical length (L) of the path of not less than 70 mm.

Incidentally, the sizes of the space in which the gas introduced spreads (the reaction space), the shower plate and the ceiling portion of the film-forming vessel are designed as follows: R1=200 mm; R2=370 mm; R3=390 mm. The shower plate 3 has such a diameter (R2) that almost all of the area of the upper cap 2 except for that occupied by the outer peripheral inert gas-injection port can be utilized as the area for heat-exchange. Thus, there can be ensured a heat-exchange area for the upper cap and the shower plate (φR2-φR1) in the order of about 2.4 times that through which a gas passes (φR1: free of any heat-exchange between the shower plate and the upper cap).

Figure 9:
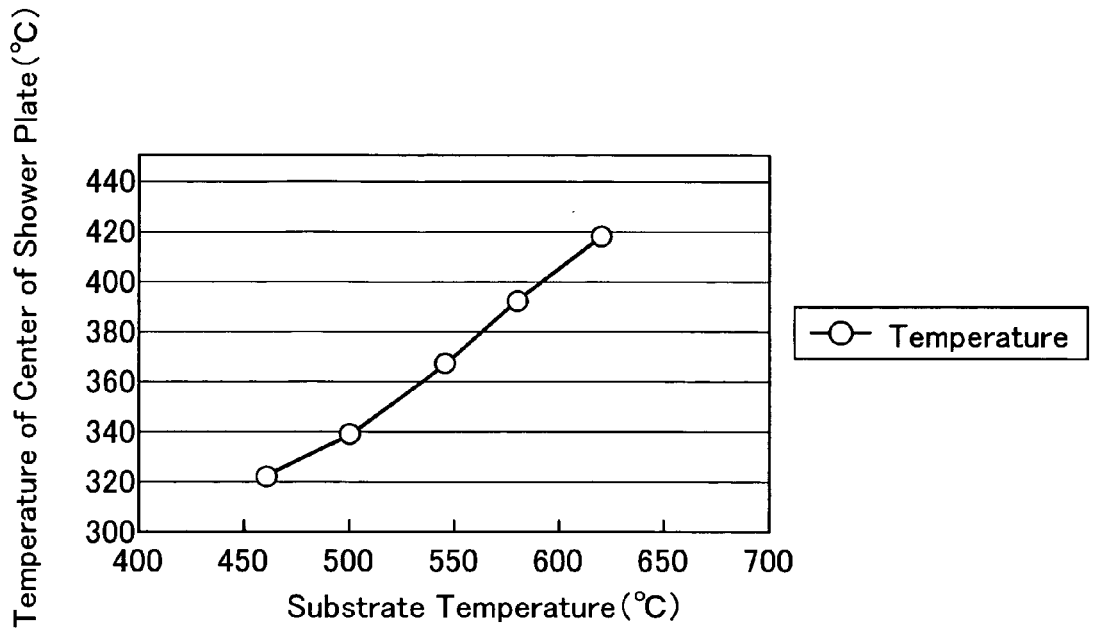
FIG. 9 is a graph showing the relation between the substrate temperature and the central temperature of the shower plate.

Further, in the device having the structure shown in FIG. 1, the substrate temperature was variously changed while setting the shower plate-substrate distance at 40 mm without controlling the temperature of the upper cap and the variation in the central temperature of the shower plate was observed. The results thus obtained are plotted on FIG. 9. The reaction space was filled with an inert gas atmosphere of 5 Torr. Among the foregoing standard film-forming conditions, the raw material may be deposited out at a substrate temperature of not more than 200° C. and decomposed at a temperature of not less than 250° C. and therefore, the temperature of the portions which may come in contact with the raw gas should be controlled to the range of from 200 to 250° C. In the device structure shown in FIG. 1 which can suppress the occurrence of any turbulent flow, convection and/or heat convection, the temperature of the shower plate opposed to the substrate at a very short distance is raised following the rise of temperature of the substrate as shown in FIG. 9 and accordingly, the temperature control of the shower plate is an essential requirement in the present invention.

Moreover, in the device structure shown in FIG. 1, the shower plate-substrate distance was changed under the following conditions: the pressure of the inert gas atmosphere: 5 Torr; the substrate temperature: 580° C., without controlling the temperature of the upper cap and the variation in the central temperature of the shower plate was confirmed. The results thus obtained are plotted on FIG. 10. The data shown in FIG. 10 clearly indicate that the effect of the shower plate-substrate distance on the shower plate temperature is rather small as compared with that of the substrate temperature on the plate, but the shower plate temperature increases if the shower plate-substrate distance is shortened (the temperature thereof increases about 16° C. when the distance is changed from 40 mm to 10 mm).

Figure 11:
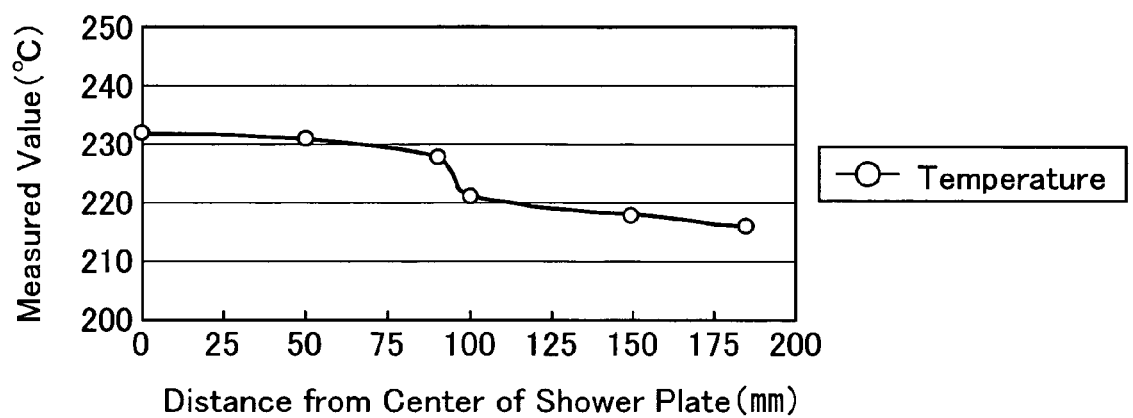
FIG. 11 is a graph showing the temperature distribution of the shower plate.

Then an oil heated to 215° C. was circulated through the upper cap of the film-forming vessel having the structure shown in FIG. 6 at a flow rate of not less than 5 L/min. The central temperature of the shower plate was found to be 232° C. under the following conditions: the pressure of the inert gas atmosphere: 5 Torr; the substrate temperature: 580° C.; the shower plate-substrate distance: 40 mm. In other words, the central shower plate temperature can be reduced by about 160° C. as compared with the temperature observed before the oil-circulation. The shower plate temperature distribution along the radial direction thus observed is shown in FIG. 11. As will be clear from the data shown in FIG. 11, the scattering in the shower plate temperature distribution falls within the range of ±10° C. and the temperature distribution in the region (φ200 mm; the radius from the center of 100 mm) through which a film-forming gas passes and whose temperature exerts the greatest influence on the film-formation was found to be quite good in the order of about ±5° C. Moreover, the temperature of the circulated oil was found to be 215° C., the upper cap temperature could be maintained at a level of not less than 210° C. and any deposition of the raw gas was not observed in the space of the upper cap through which the film-forming gas passed.

Figure 10:
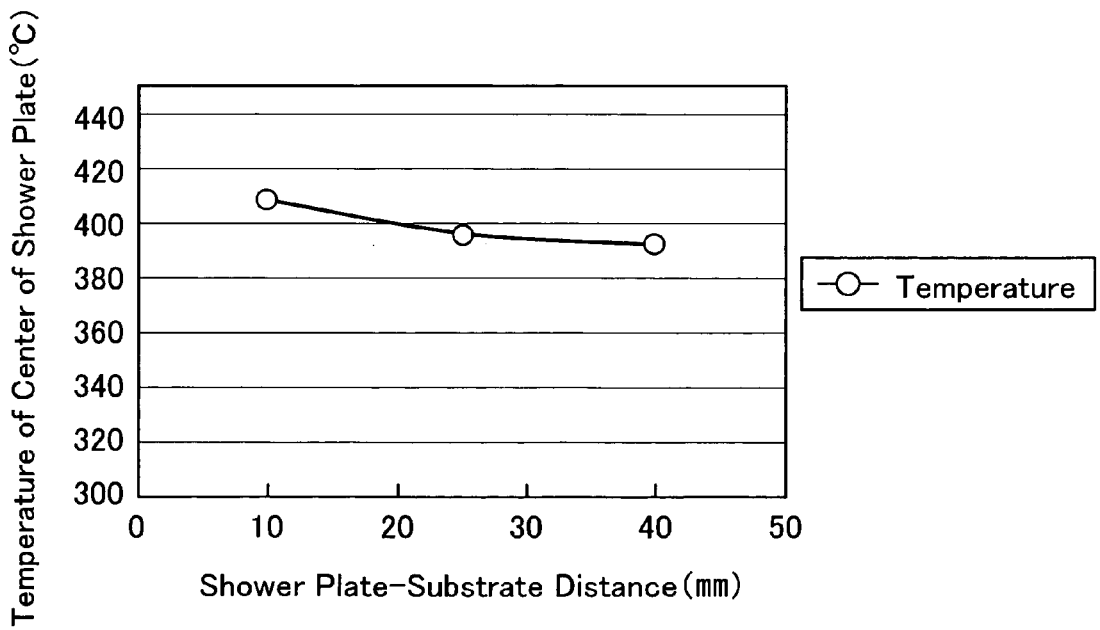
FIG. 10 is a graph showing the relation between the shower plate-substrate distance and the central temperature of the shower plate.

Further, when the shower plate-substrate distance was set at 10 mm in the structure shown in FIG. 6, the temperature increase in the region on the shower plate surface having the maximum temperature (the center of the shower plate) was found to be at highest not less than about 16.2° C. as shown in FIG. 10. Accordingly, the temperature of the shower plate can be maintained at a level ranging from 200 to 250° C. even when the shower plate-substrate distance is set at 10 mm. Moreover, the temperature of the shower plate can be optimized by properly selecting the temperature of the oil to be circulated.

If the tightening torque for the shower plate-fixing screws 3a (M6×24 screws) as shown in FIG. 6 is assumed to be 5 N·Em per screw, the force W per screw in the axial direction can be given by the following equation:

$$F=2T/D; F=W(1+\mu\Pi d)/(\Pi d-\mu l)$$

In the above equation, the symbols used are as follows: F: tightening force; T: tightening torque; d: effective diameter; l: lead of each screw; and u: frictional coefficient.

The quotient obtained by dividing the value of W×24 (the number of screws) by the area of the shower plate utilized for the heat-exchange is found to be about 28.4 kgf/cm². Therefore, the achievement of any cooling effect as shown in FIG. 11 cannot be expected unless the shower plate is pressed against the heat-exchange surface of the upper cap under a load (or power) of not less than 28.4 kgf/cm².

If thin films are formed using the device of the present invention (see FIGS. 1 to 6), thin films each having good film thickness distribution throughout the film surface as has been described above (see FIGS. 7 and 8) can be formed while ensuring a good reproducibility.

Moreover, the foregoing structure would permit the optimum control of the temperature of the shower plate, which is essential to processes wherein the raw material or reactive gas undergoes decomposition or a reaction beyond the reasonable temperature range or wherein the raw material undergoes deposition beyond the reasonable temperature range. More specifically, the structure exercises its power in the formation of films such as metallic interconnecting patterns of, for instance, Cu and Al films; barrier films of, for instance, TiN, TaN, ZrN, VN, NbN and WN; and dielectric films of, for instance, SBT, BST and STO, according to the MOCVD technique.

Additionally saying in consideration of the results shown in FIGS. 9 to 11, in the device structure as shown in FIG. 1, it is impossible to reduce the shower plate surface temperature to a level of not more than 250° C. in an environment wherein the shower head surface-substrate distance is set at a level of not more than 40 mm and the substrate temperature is not less than 580° C., unless using the structure shown in FIG. 6 in which the upper cap of the film-forming vessel is integrated with the shower head, or unless the shower head structure is incorporated into the upper cap of the film-forming vessel such that the surface area of the shower plate is almost equal to the area of the ceiling of the film-forming vessel to thus ensure a maximum contact area, and to ensure a heat-exchange area of the shower plate at least 2.4 times larger than that through which a film-forming gas passes, the oil-circulation path within the upper cap is arranged near the closest possible position on a plane on which the shower plate is to be fixed to thus improve the heat-exchange efficiency, the tapped holes for fixing the shower plate to the upper cap are so designed that they are distributed in an island-like pattern to thus make the oil-circulation path maximum and to thus devise any means for the improvement of the heat-exchange efficiency.

In the structure shown in FIG. 1, when the shower plate surface-substrate distance was set at 40 mm, the size of the reaction space A was found to be 3.6 L, while that of the lower space B was found to be 4.7 L. In other words, the volume required for the lower space existing on the secondary side of the concentric, isotropic exhaust port is in the order of about 1.3 time that of the reaction space by the elimination of any elevating mechanism for the substrate-supporting stage and the fixation of the substrate-supporting stage and this permits the miniaturization of the device. Moreover, the device permits the stable achievement of good film thickness distribution having a deviation of not more than 3% within the surface with a high reproducibility, when the size of the exhaust path (r) is set at 3 mm (vertical length L thereof=not less than 70 mm) as has been described above due to the elimination of any play for the operation of the driving system.

In the device having the structure shown in FIG. 1, the inert gas supplied to the interior of the film-forming vessel 1 through the opening 8 at the outer periphery of the upper cap is first introduced into the exterior of the deposition-inhibitory plate 6 to thus fill up the external space formed between and surrounded by the outer side of the deposition-inhibitory plate and the inner wall of the film-forming vessel and then the gas enters into the reaction space A through the injection port 9. Accordingly, the structure permits the prevention of any penetration of the film-forming gas present in the reaction space A into the outer peripheral space of the deposition-inhibitory plate and as a result, any film is never formed on the inner wall of the film-forming vessel and this in turn makes the cleaning of the film-forming vessel needless.

Additionally saying, when a film of a highly dielectric or ferroelectric substance such as a PZT, SBT or BST film is formed and the film is crystallized, it is quite difficult to remove such a film according to the plasma cleaning or chemical dry cleaning technique and therefore, the film is in general removed by the wet chemical cleaning technique using, for instance, nitric acid. For this reason, when a film is adhered to parts other than detachable ones such as the deposition-inhibitory plate, the use of additional operations is required, for instance, "removal of the film adhered by an operator through rubbing in the presence of nitric acid", which cannot be accepted in the job site for mass-production. The device of the invention has a structure which never requires the use of such dangerous operations.

Figure 12A:
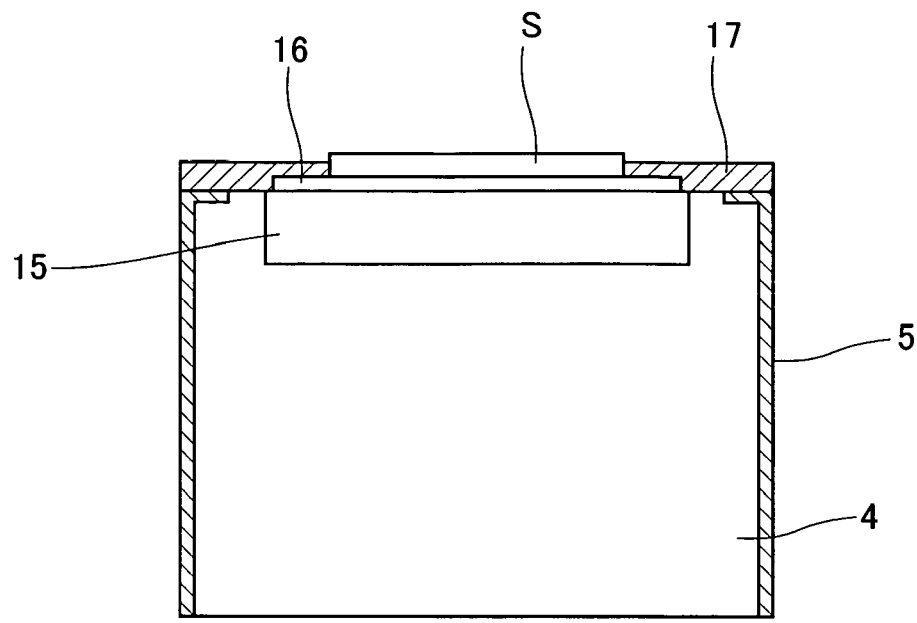
FIGS. 12A and 12B are schematic diagrams each showing an embodiment of the present invention and more specifically.
Figure 12B:
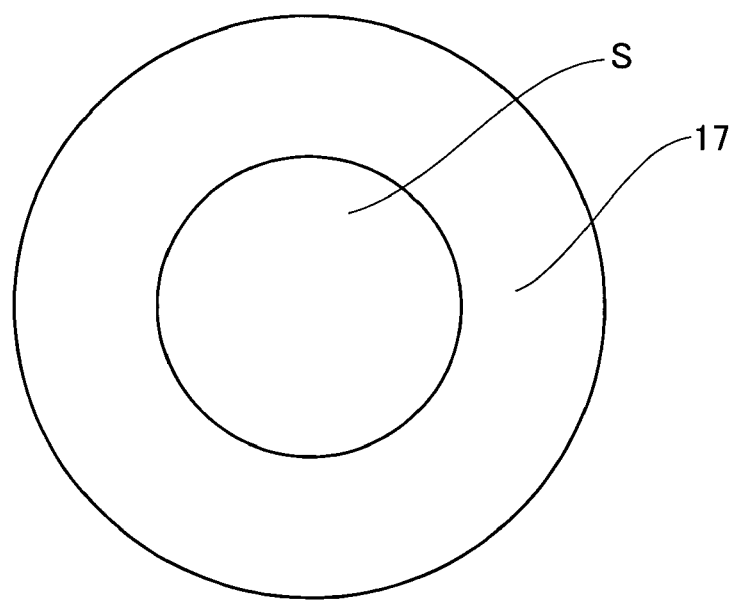

The substrate-supporting stage in an embodiment of the present invention is schematically shown in FIGS. 12A and B. FIG. 12A is a schematic cross sectional view showing the arrangement of the upper cap of the film-forming vessel and the shower plate and FIG. 12B is a top plan view thereof. In FIG. 12, the same reference numerals used in FIG. 1 are used for specifying components identical to those appearing in FIG. 1.

As shown in FIGS. 12A and 12B, a susceptor 16 made of SiC is arranged on a heat source 15 and a substrate S and a substrate-supporting member 17 are arranged on the SiC susceptor 16. The substrate-supporting member 17 is made of $Si_3N_4$. The positioning of the substrate S can be conducted by the substrate-stage member 17. The substrate-supporting stage opposed to the shower plate is flat and only the substrate to be placed on the stage is projected from the flat plane thereof. Thus, the device of this embodiment would permit the stable film-formation with a high reproducibility without generating any turbulent flow or convection in the proximity to the substrate since the substrate-supporting stage has such a structure as has been described above.

This SiC susceptor 16 has a good heat conductivity and can thus uniformly conduct the heat transferred from the heat source 15 throughout the substrate S. Further, SiC hardly undergoes any change with time through oxidation and therefore, such a structure is quite suitable for use in the case of a high temperature process wherein the substrate temperature is not less than 500° C. and oxygen is used as the reactive gas.

The SiC susceptor 16 is arranged immediately above the heat source 15 and it is exposed to a temperature higher than that of the substrate S. Therefore, if the susceptor comes in contact with the film-forming gas, a film is formed thereon at a high rate. For this reason, it is preferred in the present invention to dispose a substrate-stage member 17 for covering the SiC susceptor to thus minimize the size of the area on the susceptor, which comes in contact with the film-forming gas.

The foregoing substrate stage member 17 has such a structure that it is concentric with respect to the susceptor, the central portion thereof is in the hollow state, the diameter of the central portion is slightly larger than that of the substrate and it permits the positioning of the substrate S. The substrate stage member 17 is made of $Si_3N_4$ which has a low heat conductivity and good thermal shock resistance, it absorbs heat from the SiC susceptor 16, it can minimize the effect of destructing the temperature-uniformizing action of the SiC susceptor and it is likewise so designed that it never undergoes any breakage even in an abrupt heating cycle of the heat source 15 (the cycle for raising temperature of a substrate, within a short period of time, from room temperature to the film-forming temperature). As has been discussed above, the use of the SiC susceptor 16 arranged above the heat source for uniformly heating the substrate and the substrate-stage member 17 consisting of an $Si_3N_4$ member having a low heat conductivity and good resistance to heat cycle and oxygen gas would permit the construction of a thin film-manufacturing device provided with a substrate-supporting stage having the less frequency of breakage of the parts and which may generate only a trace amount of particles.

Incidentally, quartz was used as a material for the substrate-stage member in the course of the development of the device, but the quartz was heated to a high temperature at the portion which came in contact with the SiC susceptor, it reacted with Pb and oxygen included in the film-forming gas to thus cause a phenomenon of diffusing Pb into the quartz, the loss of $O_2$ in the quartz and the opacifying phenomenon thereof. As a result, the member underwent quality change. Moreover, the member was severely eroded during washing with nitric acid.

Further, $Al_2O_3$ was used as a material for the substrate-stage member in the course of the development of the device, but micro-cracks were formed in the region of the member which came in contact with the SiC susceptor due to an abrupt heat cycle and the member was finally broken. In addition, these micro-cracks served as a source of particles.

The foregoing substrate-stage member 17 made of $Si_3N_4$ is selected while taking into consideration the fact that the device should process several thousands of substrates per month in a mass-production device and that the member should have resistance to acid-washing repeatedly carried out since the members constituting the reaction space should be subjected to maintenance or washing with an acid at regular intervals.

According to the present invention, in addition to the foregoing, a gas exhaust path is constituted by the inner wall of a cylindrical film-forming vessel free of any unevenness and the external side of a cylindrical substrate-supporting stage; and when using a substrate-supporting stage having a shape other than a cylinder, it is so designed as to ultimately play a role as a cylindrical substrate-supporting stage and a gas exhaust path may be constituted by the external wall of the substrate-supporting stage and the inner wall of a film-forming vessel. In this respect, the gas exhaust path can be so designed that the interstice and length of the gas exhaust path can be adjusted to thus constitute an exhaust space arranged on the secondary side of the exhaust path and having a volume of 1.3 time that of the reaction space, whereby it becomes possible to realize the intended isotropic exhaust and to thus achieve a good film thickness distribution and a high film-forming rate.

Moreover, the device can likewise be so designed that the shower head structure is incorporated into the upper cap of the film-forming vessel and a path for circulating a temperature control medium is secured within the upper cap as large as possible while making the most use of the upper cap having a maximum area as a ceiling of the film-forming vessel; that the shower plate can be fixed to the upper cap; that the shower plate may have an area almost identical to that of the ceiling of the film-forming vessel; that the heat-exchange portion between the shower plate and the upper cap has an area of not less than 2.4 times the area on the shower plate through which a gas passes; and/or that the shower plate is pressed against the upper cap under a load of not less than 28.4 kgf/cm$^2$, whereby the deviation of the temperature distribution on the shower plate surface can be suppressed to a level of not more than ±10° C., even if the shower plate-substrate distance is not more than 40 mm. The same effect can be expected even if the upper cap and the shower plate have shapes other than a disk-like one.

Moreover, the use of the foregoing application examples in combination would permit the drawing of the best out of such a rectification effect of suppressing any turbulent flow, convection and/or heat convection within the film-forming vessel and, in its turn, the reaction space to thus provide a thin film-manufacturing device which can improve the film quality and film thickness distribution of the thin film formed on a substrate; which can further improve and stabilize the film thickness distribution, film compositional distribution and film-forming rate; which can suppress the generation of dust during the film-formation to a quite low level; which can reduce the formation of films within the film-forming vessel; and which can stably and continuously conduct film-forming operations.

As has been discussed above in detail, the present invention relates to a shower head whose temperature can be controlled depending on the film-forming conditions selected and also relates to a device for the manufacture of a thin film in which the shower head is utilized and a method for the manufacture thereof, which is not accompanied by the generation of particles or which is accompanied by the generation of only a trace amount of particles and which can thus stably manufacture thin films having stable film quality and film characteristics over a long period of time. These shower head, device and method can effectively be used in the fields of electrics and electronics, for instance, the manufacture of thin films such as metal oxide films.

This device would fully exercise its considerable power as a mass-producing device which should satisfy the requirements such as a low dust-generation ability and good reproducibility from the industrial standpoint. Moreover, it can exercise its considerable power, in particular, in the process which makes use of heat energy.

What is claimed is:

1. A film-forming vessel used in a thin film-manufacturing device in which a film-forming gas is downwardly introduced into an upper space of the film-forming vessel capable of being evacuated to a desired vacuum through a shower head and then a film is formed on a substrate, wherein the shower head is so designed that the shower head structure is incorporated into an upper cap of the film-forming vessel, that a heat-exchange means is disposed between a disk-like shower plate constituting a surface of the shower head and the upper cap with the heat-exchange means being in contact with both the shower plate and the upper cap to thus control temperature of the upper cap and to in turn allow heat-exchange to occur at the contact surface between the shower plate and the upper cap and that temperature of the shower head can be controlled in consideration of the film-forming conditions selected; wherein the film-forming vessel comprises:

a cavity space defined between the upper cap and the shower plate; and means for flowing a heat control fluid through the cavity space directly in contact with the upper cap and the shower plate;

a substrate supporting stage;

a stage cover surrounding an outer peripheral side wall of the substrate supporting stage and extending to a wall of the cavity;

a deposition-inhibiting plate surrounding the stage cover and arranged proximate to the side wall of the stage cover;

an opening formed in the outer periphery of the upper cap on a side of the deposition-inhibiting plate opposite the substrate supporting stage, wherein the opening is configured to receive an inert gas and communicate the inert gas to the upper space of the film forming vessel;

a gas exhaust path formed between the stage cover and the deposition-inhibiting plate each having a flat surface; and an elevating mechanism for ascending the deposition-inhibiting plate during film-formation and descending the deposition-inhibiting plate during transportation of the substrate, wherein a surface area of the shower plate is larger than a surface area of a ceiling of the upper space surrounded by the shower plate, the substrate-supporting stage and the deposition-inhibiting plate, and is substantially equal to that of a ceiling of the film-forming vessel.

2. The film-forming vessel as set forth in claim 1, wherein an area of a heat-exchanging area of the shower plate is not less than 2.4 times that on the shower plate through which a film-forming gas passes; the shower plate is pressed against the upper cap of the film-forming vessel at a load of not less than 28.4 kgf/cm$^2$ under an atmospheric pressure; a thickness of a portion on the shower plate through which the film-forming gas passes is set at a level of not more than 5 mm; and the thickness of the area, on which heat-exchange between the shower plate and the upper cap of the film-forming vessel takes place, is larger than that of the area on the shower plate through which a film-forming gas passes.

3. A thin film-manufacturing device in which a film-forming gas is downwardly introduced into an upper space of a film-forming vessel capable of being evacuated to a desired vacuum through the shower head and then a film is formed on a substrate, wherein the device is so designed that a shower head structure is incorporated into an upper cap of the film-forming vessel, that a heat-exchange means is disposed between a disk-like shower plate constituting a surface of the shower head and the upper cap with the heat-exchange means being in contact with both the shower plate and the upper cap to thus control temperature of the upper cap and to in turn allow heat-exchange to occur at a contact surface between the shower plate and the upper cap and that temperature of the shower head can be controlled in consideration of film-forming conditions selected; wherein the thin film-manufacturing device comprises:

a cavity space defined between the upper cap and the shower plate; and means for flowing a heat control fluid through the cavity space directly in contact with the upper cap and the shower plate;

a substrate-supporting stage;

a stage cover surrounding an outer peripheral side wall of the substrate supporting stage and extending to a wall of the cavity;

a deposition-inhibiting plate surrounding the stage cover and arranged proximate to a side wall of the stage cover;

an opening formed in the outer periphery of the upper cap on a side of the deposition-inhibiting plate opposite the substrate supporting stage, wherein the opening is configured to receive an inert gas and communicate the inert gas to the upper space of the film forming vessel;

a gas exhaust path formed between the stage cover and the deposition-inhibiting plate each having a flat surface; and an elevating mechanism for ascending the deposition-inhibiting plate during film formation and descending the deposition-inhibiting plate during transportation of the substrate, wherein a surface area of the shower plate is larger than a surface area of a ceiling of the upper space surrounded by the shower plate, the substrate-supporting stage and the deposition-inhibiting plate, and is substantially equal to that of a ceiling of the film-forming vessel.

4. The thin film-manufacturing device as set forth in claim 3, wherein an area of a contact surface as heat-exchanging area between the shower plate and the upper cap is not less than 2.4 times that on the shower plate through which the film-forming gas passes.

5. The thin film-manufacturing device as set forth in claim 3, wherein the shower plate is pressed against the upper cap of the film-forming vessel at a load of not less than 28.4 kgf/cm$^2$ under an atmospheric pressure.

6. The thin film-manufacturing device as set forth in claim 3, wherein a thickness of a portion on the shower plate through which the film-forming gas passes is set at a level of not more than 5 mm.

7. The thin film-manufacturing device as set forth in claim 3, wherein a thickness of a portion on which heat-exchange between the shower plate and the upper cap of the film-forming vessel takes place is larger than that of the portion on the shower plate through which the film-forming gas passes.

8. The thin film-manufacturing device as set forth in claim 3, wherein an inner diameter of the film-forming vessel is larger than the diameter of a surface of the shower head and the shower head surface diameter is larger than an inner diameter of the upper space.

9. The thin film-manufacturing device as set forth in claim 8, wherein a difference between the inner diameter of the film-forming vessel and the diameter of the shower head surface is not more than 20 mm.

10. The thin film-manufacturing device as set forth in any one of claims 3 to 9, wherein the device is further equipped with a means for controlling an internal temperature of the film-forming vessel to a range of from room temperature to 250° C.

11. The thin film-manufacturing device as set forth in claim 3, wherein the shower plate and the upper cap of the film-forming vessel are provided with a through hole which allows the shower head and the upper cap to communicate these members with one another and a meter for determining pressure is connected to the hole.

12. The film-forming vessel as set forth in claim 1, wherein a reaction space extends from the shower plate to the substrate supporting stage and the deposition-inhibiting plate, and wherein the reaction space is smaller than the exhaust path when the deposition-inhibiting plate is elevated.

13. The film-forming vessel as set forth in claim 12, further comprising an injection port formed between the deposition-inhibiting plate and the shower plate when the deposition-inhibiting plated is elevated, wherein the injection port communicates the opening to the reaction space which extends from the shower plate to the substrate supporting stage and the deposition-inhibiting plate.

14. The film-forming vessel as set forth in claim 13, wherein the injection port is configured to communicate the inert gas to the reaction space and toward the exhaust path.

* * * * *